United States Patent [19]

Ebbing et al.

[11] Patent Number: 5,224,581
[45] Date of Patent: Jul. 6, 1993

[54] MAGNETIC SEMICONDUCTOR WAFERS WITH HANDLING APPARATUS AND METHOD

[75] Inventors: Peter Ebbing, Los Altos; Jack Ford, San Jose, both of Calif.

[73] Assignee: Applied Materials, Inc., Santa Clara, Calif.

[21] Appl. No.: 852,463

[22] Filed: Mar. 17, 1992

Related U.S. Application Data

[62] Division of Ser. No. 450,779, Dec. 14, 1989, Pat. No. 5,147,829.

[51] Int. Cl.⁵ ............................................. B65G 15/64
[52] U.S. Cl. .................................. 198/345.1; 198/619
[58] Field of Search ......................... 198/345.1, 619

[56] References Cited

U.S. PATENT DOCUMENTS

| | | | |
|---|---|---|---|
| 3,571,911 | 3/1971 | Littwin | 29/558 |
| 3,887,996 | 6/1975 | Hartleroad et al. | 29/744 X |
| 3,887,997 | 6/1975 | Hartleroad et al. | 29/744 X |
| 4,645,218 | 2/1987 | Ooshio et al. | 361/145 X |
| 4,724,222 | 2/1988 | Feldman | 29/559 X |
| 4,771,358 | 9/1988 | Millner | 361/145 |

*Primary Examiner*—Joseph E. Valenza
*Assistant Examiner*—Cheryl L. Gastineau
*Attorney, Agent, or Firm*—Birgit E. Morris

[57] ABSTRACT

A semiconductor wafer is provided with magnetic material about the periphery for magnetically clamping the wafer on a seating gasket at the processing station. The seating gasket is annular for peripherally supporting the wafer. An electro-magnet establishes a peripheral station magnetic field which attracts the wafer magnetic material to form the clamp. The station magnetic field may by reversed to levitate the wafer onto and off of the seating gasket.

14 Claims, 3 Drawing Sheets

MAGNETIC SEMICONDUCTOR WAFERS WITH HANDLING APPARATUS AND METHOD

This is a division of application Ser. No. 07/450,779 filed Dec. 14, 1989, U.S. Pat. No. 5,147,829.

TECHNICAL FIELD

This invention relates to semiconductor wafers and wafer processing, and more particularly to magnetic handling of wafers during processing.

BACKGROUND

Heretofore, mechanical grippers which engaged the edge of the wafer were used to transfer and seat the wafer at each processing station. After seating the wafer was clamped by overhead fingers extending from a peripheral collar which urged the wafer down against a seating gasket. The overhead fingers interfered with access to the active top surface during processing causing "shadows" in the processed structures. Further, the finger points of pressure created uneven internal stress within the wafer crystal structure.

SUMMARY

It is therefore an object of this invention to provide a magnetic semiconductor wafer.

It is another object of this invention to provide such a wafer processing station which magnetically transfers the wafer to and from the processing station.

It is another object of this invention to provide such a wafer processing station which magnetically seats the wafer at the processing station.

It is a further object of this invention to provide a method of magnetically handling semiconductor wafers.

Briefly, these and other objects of the present invention are accomplished by providing a magnetic semiconductor wafer having a substrate formed of semiconductor material with an active side to be processed into circuits and a base side for supporting the wafer during processing. Magnetic material is formed on the base side of the wafer for assisting in magnetically handling the wafer during the wafer processing. A resilient seating gasket is provided at a processing station for receiving and supporting the wafer. An electro-magnet is positioned proximate the resilient seating gasket for establishing a station magnetic field which releasably engages the magnetic material on the wafer for clamping the wafer against the gasket. The wafer is transferred at the processing station by magnetic levitation by establishing a station magnetic field between the seating gasket and the magnetic material on the wafer.

BRIEF DESCRIPTION OF THE DRAWING

Further objects and advantages of magnetic wafer and the operation of the processing station will become apparent from the following detailed description and drawing in which.

Figures 1A, 1B:
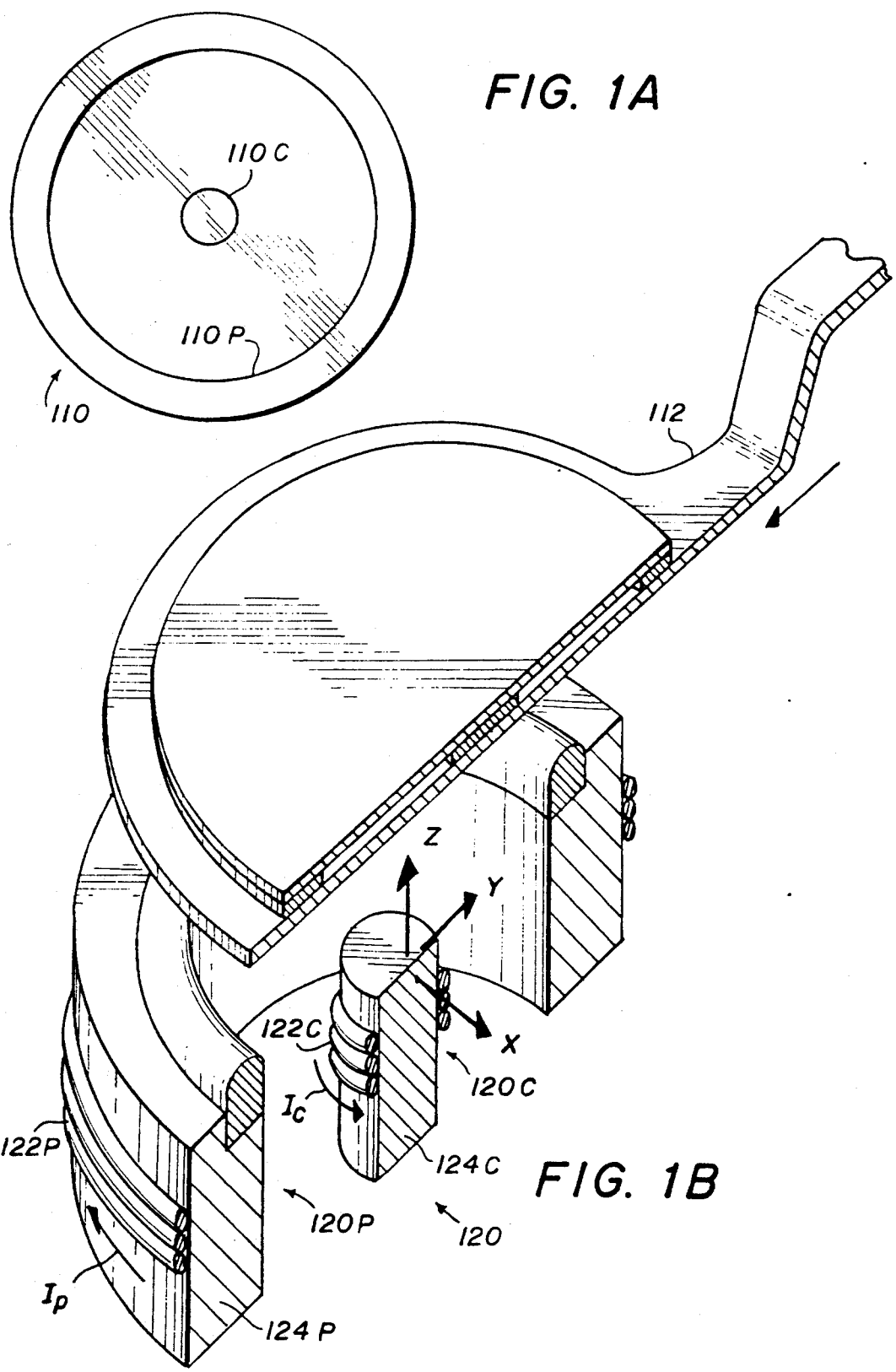
FIG. 1A is a plan view of a magnetic wafer showing a peripheral levitation magnet and a central stabilizing magnet.
FIG. 1B is a sectional perspective view of a wafer processing station showing a magnetic wafer being transferred to the processing station.

The first digit of each reference numeral in the drawing indicates the Figure in which that element is described. The second and third digits indicate related structural elements, and the final letter indicates an element subportion.

LEVITATION EMBODIMENTS

FIGS. 1A 1B 1C and 1D

Magnetized regions on a semiconductor wafer may be used to magnetically engage and control the wafer during wafer processing for fabrication. The wafer may be magnetically transferred between processing stations by levitation without physical contact to the wafer. Once seated the wafer forms part of a magnetic gasket.

Figure 1C:
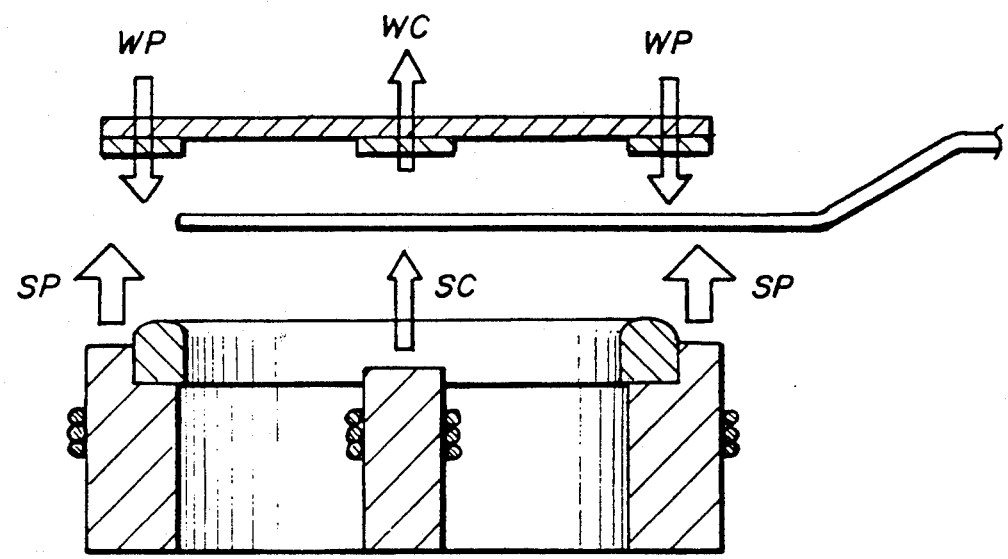
FIG. 1C, 1D and 1E show the magnetic wafer levitating in the wafer levitation position, seated in the wafer rest position, and clamped in the wafer processing position respectively.
Figure 1D:
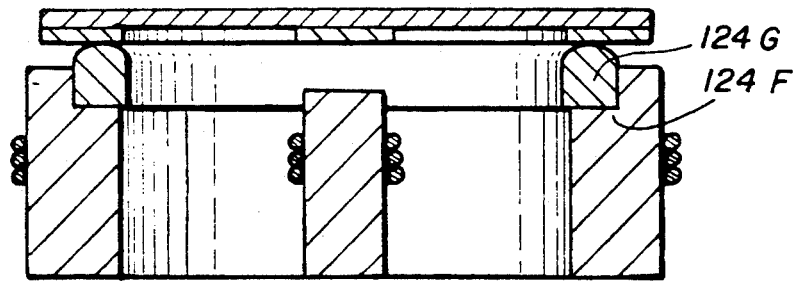
Figure 1E:
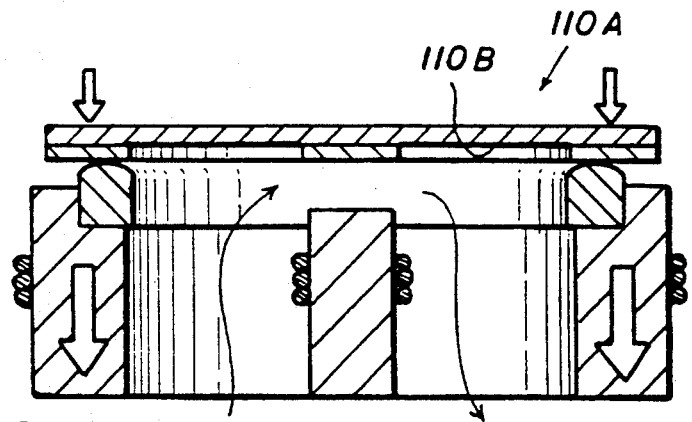

Wafer 110 (FIG. 1A) has a peripheral levitating magnet region 110P and a central stabilizing magnet region 110C formed of a suitable ferromagnetic material. The magnet regions have a relative permeability noticeably greater than unity (typically from about 1.1 to about 1,000,000) which exhibits hysteresis and is therefore capable of forming a magnet. The direction of the levitating flux through the peripheral region is normal to the plane of the wafer as indicated by arrows WP (wafer peripheral magnetic field) as shown in FIG. 1C. The stabilizing flux through the central region is of the opposite polarity as indicated by arrow WC (wafer central magnetic field).

The magnetic wafer is delivered to processing station 120 (FIG. 1B) by a suitable non-magnetic delivery device such as platform structure 112. The processing station has a relatively strong peripheral electro-magnet 120P for levitating the wafer during transfer, formed by current Ip through coils 122P around peripheral core member 124P. Processing station 120 also has a relatively weak central electro-magnet 120C for stabilizing the wafer during levitation, formed by current Ic through coils 122C around central core member 124C.

During levitation the polarity of the peripheral electro-magnet is opposed to wafer flux WP as indicated by arrows SP (station peripheral magnetic field) as shown in FIG. 1C for providing the lift necessary to levitate the wafer into the wafer levitation position. The repelling force between wafer flux WP and station flux SP determines the levitation height of the wafer along vertical axis Z of the processing station. An increase (or decrease) in current Ip will produce a stronger (or weaker) flux SP with more (or less) repelling force which displaces the wafer higher (or lower).

The polarity of the central electro-magnet field shown by arrow SC (station central magnetic field) is the same as the wafer central region polarity WC for stabilizing the wafer in the levitation position over the processing station. The attraction between flux WC and flux SC is sufficient to inhibit lateral movement of the wafer; but is insufficient to materially counter the levitating force of the peripheral levitating magnet.

Horizontal stabilization may be enhanced by providing a concentric magnetic nest or well for the wafer which centers the wafer in the levitation position by creating a peripheral magnetic barrier to XY plane movement. In the embodiment shown in FIGS. 1B-E, the peripheral core member 124P is an annular or circular ring concentric with seating gasket 124G and having a slightly larger diameter than annular or circular ring of peripheral magnet 110P on the wafer. The opposing peripheral flux fields WP and SP maintain a concentric relationship, keeping the wafer centered within field SP and thus centered over the processing station. The centered wafer settles to the lowest vertical levitation position permitted by the combined effect of the peripheral levitating fields WP and SP and the center stabilizing fields WC and SC. This minimum energy position defines a stable levitating wafer transfer position (FIG. 1C) for wafer delivery and pick-up.

Because of the wafer centering capability of the processing station, the location of transfer platform 112 at delivery need not be concentric with the wafer levitation position. The wafer is presented to the processing station at a platform delivery position slightly lower than the wafer levitation position. As the platform approaches the center area of the processing station (FIG. 1C) the wafer levitates up from the platform into the wafer levitation position.

A smooth transfer may be obtained by starting the delivery cycle with the processing station flux fields turned off (Ip and Ic=0) or at some sub-levitation level. After the platform has moved into the delivery position, the station flux is slowly established to levitate the wafer from the delivery position up to the wafer levitation position.

Wafer 110 is then levitated downward into a rest position within processing station 120 (FIG. 1D) by reducing current Ip through peripheral coils 122P. When current Ip reaches a minimum value Ip: min, the repelling force is insufficient to maintain even low level levitation of the wafer. The wafer becomes seated at the rest position centered on suitable seating support such as annular gasket 124G within retaining flange 124F in peripheral core member 124P. When the processing at the station is completed, the wafer is raised to the levitation position for pick-up by increasing current Ip to an Ip:lev value. The vertical positioning of the wafer along the Z axis is accomplished without mechanical contact with the wafer avoiding the contact problems of the prior art devices.

The stabilizing attraction between wafer flux WC and station flux SC prevents lateral shifting of the wafer within the XY plane and tipping of the wafer out of the XY plane. The strength of the stabilizing center flux SC and may be only a fraction of the stronger levitating field of the peripheral flux WP and SP. Stabilizing current Ic through central electro-magnet may be increased and reduced proportionally with the levitating current Ip in order to optimize the lateral and tip stabilization without over damping. Ic may be zero when the wafer is in the processing position to avoid radial bending stress across the wafer.

MAGNETIC GASKET EMBODIMENT

FIG. 1E

Heat generated within wafer 110 during the processing of active side 110A at processing station 120 (FIG. 1E) may be removed by a suitable cooling mechanism such as conduction through seating gasket 124G or by convection through fluid flow 130 within flow chamber 130F.

Support gasket 124G may be a resilient heat conductive ring forming a compressible clamping gasket between the periphery of the wafer and the top of peripheral core member 124P. Heat from the wafer flows across the thermally conductive gasket and into the thermally conductive metal of peripheral core 124P. The peripheral area of contact between the wafer and ring gasket 124G is expanded to accommodate the heat flow (FIG. 1E) by downward pressure generated by reversing the current through peripheral coils 122P. The reverse current −Ip establishes a clamping magnetic flux in the same direction as flux WP provided by peripheral magnet 110P on the wafer which urges the wafer against the gasket causing the gasket to compress. The resulting magnetic clamp is continuous and uniform around the periphery of the wafer and avoids the non-uniform stress problem caused by the pressure fingers on prior art clamping collars. In addition, active side 110A is fully accessible for shadow free processing because all of the clamping structure is located on base side 110B.

An inert fluid such as helium gas may be circulated through heat transfer flow chamber 130F across base side 110B of the wafer to remove wafer heat by convection. The gasket interface between the wafer and flow chamber 130F may be sealed by the clamping pressure to minimize loss of the convection fluid and especially to prevent leakage of the fluid into the processing environment above active side 110A.

At the end of the processing cycle at the processing station, the temperature of the wafer is stabilized and fluid flow 130 is terminated. The clamping flux is gradually eliminated by slowly reducing the clamping current −Ip to relieve the compressive force on the gasket. The current passes through zero and becomes levitating current Ip for establishing flux SP which levitates the wafer into the levitation position for pick-up.

RADIAL WAFER FIELD

FIG. 2A

Figure 2A:
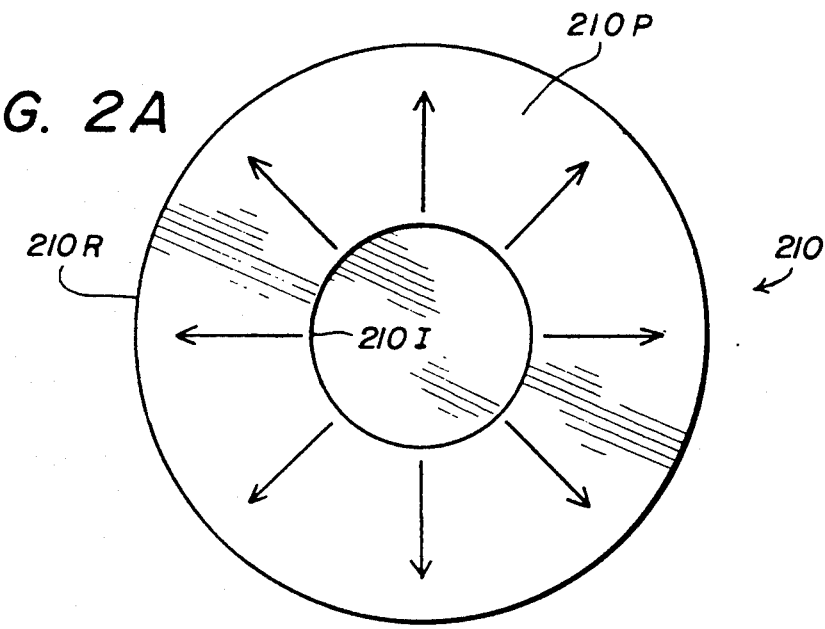
FIG. 2A is a plan view of a magnetic wafer with a radially extending field.

The magnetic field of the wafer may extend radially in the XY plane of the wafer (FIG. 2A) instead of in the Z direction through the wafer as shown in the FIG. 1 embodiments. Wafer 210 has a wide peripheral magnet 210P with the flux extending parallel to the plane of the wafer. The flux extends radially in the long dimension of the magnet for defining an inner magnetic pole 210I and an outer or rim magnetic pole 210R of opposite magnetic polarity.

DOUBLE WELL STATION

FIG. 2B

Figure 2B:
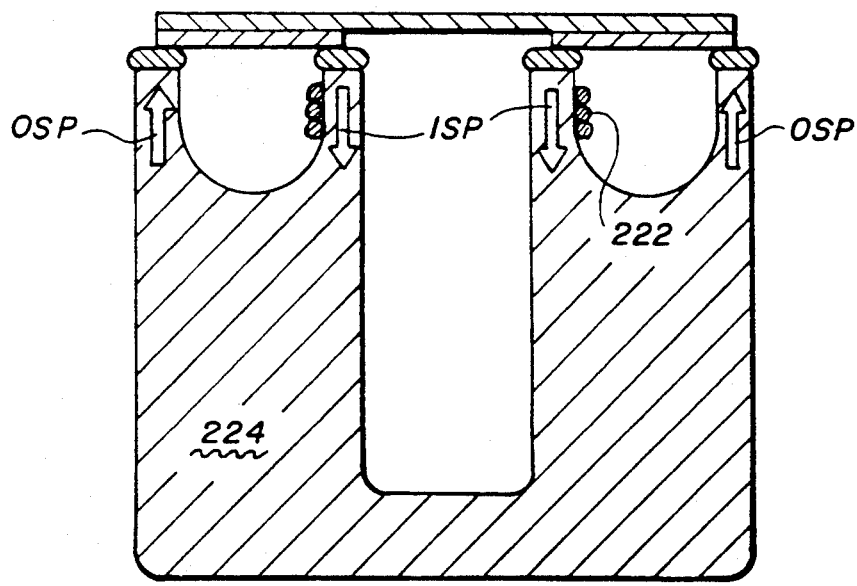
FIG. 2B is a sectional view of a processing station with double magnetic well.

A pair of concentric levitating fields (FIG. 2B) may be provided by convoluted core 224. Current Ip through coil 222 around the inner wall of the toroid core established two peripheral levitating fields: an inner levitating field ISP and an outer levitating field OSP of opposite polarity. The concentric fields provide a double nesting effect for maintaining the wafer in the levitation position. The two contact rings between the wafer and the core provide two paths for heat flow out of the wafer.

PARAMAGNETIC EMBODIMENT

FIG. 3

Figure 3:
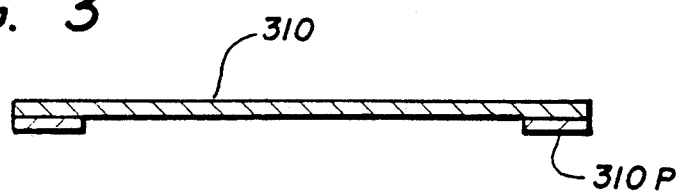
FIG. 3 is a sectional view of a paramagnetic wafer.

Wafer 310 (FIG. 3) has a peripheral clamping magnetic region 310P formed of a suitable paramagnetic material having a relative permeability slightly greater than unity (typically from about 1.000 to about 1.001) which is capable of being attracted by a the station magnetic field to form a gasket at the processing station. When the gasket is released, the hysteresis within the paramagnetic wafer material may be overcome by reversing the urging magnetic field to provide a slightly repelling field.

INDUSTRIAL APPLICABILITY

It will be apparent to those skilled in the art that the objects of this invention have been achieved as described hereinbefore by providing a magnetic semiconductor wafer. Magnetic material on the wafer assists in magnetically handling the wafer during the wafer processing. A resilient seat is provided at a processing station for receiving and supporting the wafer. An electromagnet establishes a station magnetic field which releasably clamps the magnetic material on the wafer against the seat. The wafer is transferred at the processing station by magnetic levitation maintained by a station magnetic field between the seat and the magnetic material on the wafer.

CONCLUSION

Clearly various changes may be made in the structure and embodiments shown herein without departing from the concept of the invention. Further, features of the embodiments shown in the various Figures may be employed with the embodiments of the other Figures.

Therefore, the scope of the invention is to be determined by the terminology of the following claims and the legal equivalents thereof.

We claim as our invention;

1. Apparatus for supporting a semiconductor wafer having magnetic material on the backside thereof at a processing station during wafer processing comprising:
   a) resilient seating means for receiving and supporting the wafer during wafer processing; and
   b) electromagnet means proximate the seating means for establishing a magnetic field between the seating means and the magnetic material on the wafer thereby urging the wafer against the seating means.

2. The apparatus of claim 1 wherein the seating means is an annular resilient ring for supporting the periphery of the wafer, and the magnetic field urges the wafer into compressive engagement with the seating means causing the seating means to compress and establish an area contact between the seating means and the periphery of the wafer.

3. The apparatus of claim 2, wherein the annular seating means and the electro-magnet means are thermally conductive for conducting heat away from the wafer during the wafer processing.

4. The apparatus of claim 2 further comprising a semiconductor wafer having magnetic material on the backside thereof and a peripheral region for engagement with said seating means.

5. The apparatus of claim 4, wherein the electromagnet means provides a peripheral magnetic field concentric with the annular seating means.

6. The apparatus of claim 5, wherein the magnetic material on the back side of the wafer is paramagnetic and is attracted by the magnetic field.

7. The apparatus of claim 5, wherein the magnetic material on the back side of the wafer is ferromagnetic for establishing a wafer magnetic field which reacts with the station magnetic field.

8. The apparatus of claim 7, wherein the electromagnetic means is reversible for reversing the direction of the magnetic field for providing a seating force which attracts the wafer ferromagnetic material when the magnetic field is in one direction, and for providing a levitating force which repels the wafer ferromagnetic material when the magnetic field is in the other direction.

9. The apparatus of claim 8, further comprising a non-magnetic transfer means for presenting new wafers to the processing station which are transferred to the seating means by magnetic levitation, and for carrying processed wafers which are transferred from the seating means by magnetic levitation.

10. The apparatus of claim 8, wherein the magnetic field is circular and peripheral to the annular seating means, and the wafer magnetic field is circular and peripheral to the wafer and slightly smaller than the station magnetic field for establishing a magnetic well for retaining the wafer during levitation.

11. The apparatus of claim 10, further comprising magnetic material located in the central region of the wafer having the opposite direction as the peripheral wafer magnetic field for establishing a stabilizing magnetic field during levitation which attracts the station magnetic field.

12. The apparatus of claim 10, wherein the wafer magnetic field extends normal to the wafer.

13. The apparatus of claim 10, wherein the wafer magnetic field extends parallel to the wafer providing an inner pole and a outer pole.

14. The apparatus of claim 13, wherein the electromagnetic means provides an outer peripheral station magnetic field for engaging the outer wafer pole and an inner station magnetic field for engaging the inner wafer pole.

* * * * *